(12) United States Patent
Murakami et al.

(10) Patent No.: US 10,672,617 B2
(45) Date of Patent: Jun. 2, 2020

(54) ETCHING METHOD AND ETCHING APPARATUS

(71) Applicant: TOKYO ELECTRON LIMITED, Tokyo (JP)

(72) Inventors: Hiroki Murakami, Nirasaki (JP); Takahiro Miyahara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/937,260

(22) Filed: Mar. 27, 2018

(65) Prior Publication Data
US 2018/0286691 A1 Oct. 4, 2018

(30) Foreign Application Priority Data
Mar. 30, 2017 (JP) ................. 2017-066857

(51) Int. Cl.
*H01L 21/3065* (2006.01)
*H01L 21/67* (2006.01)
*H01J 37/32* (2006.01)
*H01L 21/02* (2006.01)

(52) U.S. Cl.
CPC .... *H01L 21/3065* (2013.01); *H01J 37/32091* (2013.01); *H01J 37/32357* (2013.01); *H01J 37/32449* (2013.01); *H01J 37/32467* (2013.01); *H01J 37/32513* (2013.01); *H01J 37/32568* (2013.01); *H01J 37/32715* (2013.01); *H01J 37/32724* (2013.01); *H01J 37/32743* (2013.01); *H01J 37/32834* (2013.01); *H01L 21/67069* (2013.01); *H01L 21/67109* (2013.01); *H01J 37/32082* (2013.01); *H01J 37/32559* (2013.01); *H01J 2237/002* (2013.01); *H01J 2237/334* (2013.01); *H01L 21/0262* (2013.01); *H01L 21/02532* (2013.01)

(58) Field of Classification Search
CPC .................................................. H01L 21/3065
USPC ....................................................... 438/715
See application file for complete search history.

(56) References Cited

U.S. PATENT DOCUMENTS

| | | | |
|---|---|---|---|
| 7,208,354 B2 * | 4/2007 | Bauer | H01L 21/02381 438/151 |
| 2015/0126039 A1 * | 5/2015 | Korolik | H01L 21/3065 438/718 |
| 2016/0225637 A1 * | 8/2016 | Takahashi | H01L 21/3065 |

FOREIGN PATENT DOCUMENTS

JP 2016-143781 A 8/2016

* cited by examiner

*Primary Examiner* — Roberts P Culbert
(74) *Attorney, Agent, or Firm* — Nath, Goldberg & Meyer; Jerald L. Meyer

(57) ABSTRACT

There is provided an etching method which includes supplying an etching gas including an $H_2$ gas or an $NH_3$ gas to a target substrate having a germanium portion in an excited state; and etching the germanium portion.

6 Claims, 9 Drawing Sheets

SiN  Ge

SiN  Ge

ETCHING METHOD AND ETCHING APPARATUS

CROSS-REFERENCE TO RELATED APPLICATION

This application is based upon and claims the benefit of priority from Japanese Patent Application No. 2017-066857, filed on Mar. 30, 2017, the entire contents of which are incorporated herein by reference.

TECHNICAL FIELD

The present disclosure relates to an etching method and an etching apparatus of germanium (Ge), and a non-transitory computer-readable storage medium.

BACKGROUND

Recently, semiconductor integrated circuit devices are required to operate at a high speed. The speedup of operation is mainly driven by the miniaturization of semiconductor devices such as transistors or the like, the reduction in wiring resistance, the reduction in dielectric constant of interlayer insulating films, and the like. However, there are limitations in the advancement of progress utilizing these techniques. Therefore, in order to make further advancements, silicon germanium (hereinafter also referred to as SiGe) or germanium (hereinafter also referred to as Ge), which is a semiconductor material having a higher carrier mobility, draws attention instead of silicon (hereinafter also referred to as Si), which has been used as a semiconductor material.

When Ge or SiGe is applied to a semiconductor device, a technique of etching Ge or SiGe with high selectivity is required. For example, a technique of selectively etching SiGe with respect to Si using a $F_2$ gas or both a $F_2$ gas and an $NH_3$ gas has been used.

However, in the related art, only SiGe etching is performed, and Ge is not etched. For dry etching of Ge, a halogen gas or a high temperature thermal oxidizing treatment has been used. However, the selectivity thereof to other materials is not sufficient.

SUMMARY

Some embodiments of the present disclosure provide a technique capable of selectively etching germanium (Ge) with respect to other materials by a dry etching process.

According to one embodiment of the present disclosure, there is provided an etching method, including: supplying an etching gas including an $H_2$ gas or an $NH_3$ gas to a target substrate having a germanium portion in an excited state; and etching the germanium portion.

According to another embodiment of the present disclosure, there is provided an etching apparatus for etching a target substrate having germanium, including: a processing container configured to accommodate the target substrate; a gas supply part configured to supply a predetermined gas into the processing container; an excitation mechanism configured to excite the predetermined gas; a heating mechanism configured to heat an interior of the processing container; an exhaust mechanism configured to evacuate the interior of the processing container to bring the processing container into a depressurized state; and a controller configured to control the gas supply part, the excitation mechanism, the heating mechanism and the exhaust mechanism, wherein the controller is configured to: control the interior of the processing container to a predetermined depressurized state by the exhaust mechanism; control the interior of the processing container to a predetermined temperature by the heating mechanism; control the gas supply part to supply an etching gas containing an $H_2$ gas or an $NH_3$ gas; control the excitation mechanism to excite the etching gas; and etch the germanium of the target substrate inside the processing container using the etching gas in an excited state.

According to another embodiment of the present disclosure, there is provided a non-transitory computer-readable storage medium operating on a computer and storing a program for controlling an etching apparatus, wherein when the program is executed by the computer, the program controls the etching apparatus to perform the aforementioned etching method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
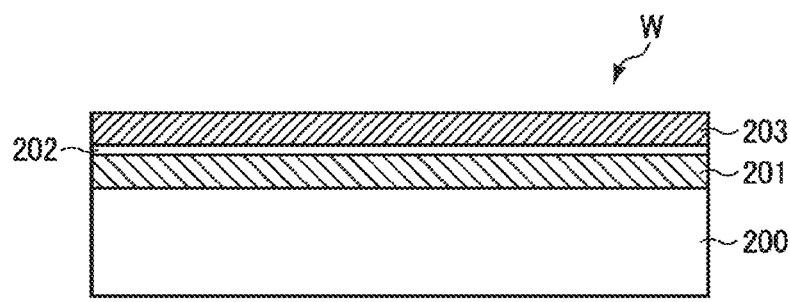
FIG. 1 is a schematic sectional view of a target substrate according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Outline of Etching Method>

The present inventors have repeatedly studied a method capable of etching a germanium (Ge) portion existing on a target substrate. As a result, the present inventors have found that the Ge portion can be etched by an extremely simple method of supplying an etching gas containing an $H_2$ gas or an $NH_3$ gas (hereinafter also simply referred to as etching gas) to the substrate in an excited state and further that this method has high selectivity with respect to other materials.

As used herein, the term "Ge portion" is typically a Ge film. The Ge film is formed by a CVD method using a Ge raw material gas. As the Ge raw material gas, any Ge-containing compound applicable to the CVD method may be used. Although not particularly limited, typical examples of the Ge raw material gas may include germane-based compounds such as monogermane ($GeH_4$), digermane ($Ge_2H_6$) and the like. The Ge film formed by the CVD method contains hydrogen (H) and the like as unavoidable impurities.

The etching gas contains an $H_2$ gas or an $NH_3$ gas. The etching gas may be only the $H_2$ gas or the $NH_3$ gas, or may contain an inert gas, for example, a noble gas such as an Ar gas or the like, in addition to the $H_2$ gas or the $NH_3$ gas.

The method of exciting the etching gas is not particularly limited. For example, the etching gas may be excited by plasma. The plasma may be remote plasma which is generated by an appropriate method outside a processing container and introduced into the processing container, or may be generated inside the processing container.

The temperature of the substrate when etching the germanium portion may fall within a range of 200 to 400 degrees C., and the treatment pressure may fall within a range of 0.05 to 1.0 Torr (6.7 to 133 Pa).

As described above, by supplying the etching gas containing an $H_2$ gas or an $NH_3$ gas in an excited (plasma-converted) state, it is possible to effectively etch the Ge portion and to achieve high selectivity with respect to other materials. In particular, it is possible to achieve high selectivity with respect to silicon-containing materials. Examples of such silicon-containing materials may include silicon (Si) and SiGe. For example, when the Ge film coexists with a SiGe film or a Si film, only the Ge film may be etched without substantially etching the SiGe film or the Si film. In this regard, the SiGe film is formed by a CVD method using a Ge raw material gas and a Si raw material gas, and the Si film is formed by a CVD method using a Si raw material gas. As the Si raw material gas, any Si-containing compound applicable to the CVD method may be used. Although not particularly limited, typical examples of the Si raw material gas may include silane-based compounds such as monosilane ($SiH_4$), disilane ($Si_2H_6$) and the like. Even if the SiGe film is a Ge-rich one of about 90 at %, Ge may be etched with high selectivity. In addition, even if the silicon-containing material is an insulating film such as a silicon nitride film (SiN film), a silicon oxide film ($SiO_2$ film) or the like, Ge may be etched with high selectivity.

FIG. 1 is a sectional view showing an example of a substrate having a Ge portion. In the substrate of this example, an insulating film 201 composed of a $SiO_2$ film, a SiN film or the like is formed on a semiconductor substrate 200. A Ge film 203 made of Ge is formed on the insulating film 201 with an amorphous Si film 202 interposed between the Ge film 203 and the insulating film 201. Since the Ge film 203 is not formed on the insulating film 201, the amorphous Si film 202 as a Si seed is formed.

The insulating film 201, the amorphous Si film 202 and the Ge film 203 may be formed by CVD.

By supplying the etching gas containing an $H_2$ gas or an $NH_3$ gas to such a substrate in an excited (plasma-converted) state and etching the substrate, the Ge film 203 may be etched with high selectivity without substantially etching the amorphous Si film 202 and the insulating film 201.

<Example of Treatment Apparatus>

Figure 2:
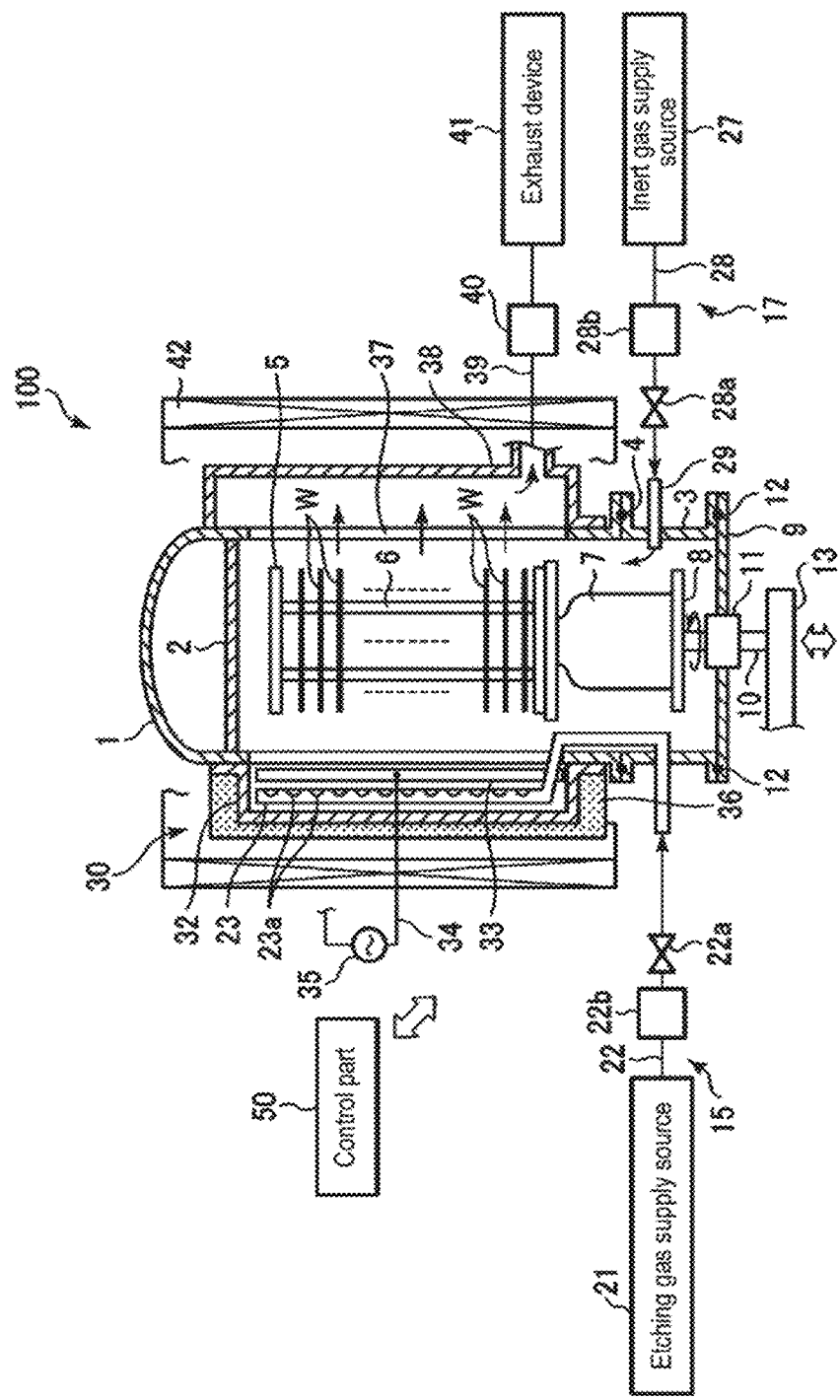
FIG. 2 is a vertical sectional view showing an example of an etching apparatus that may be used for carrying out an etching method according to an embodiment of the present disclosure.
Figure 3:
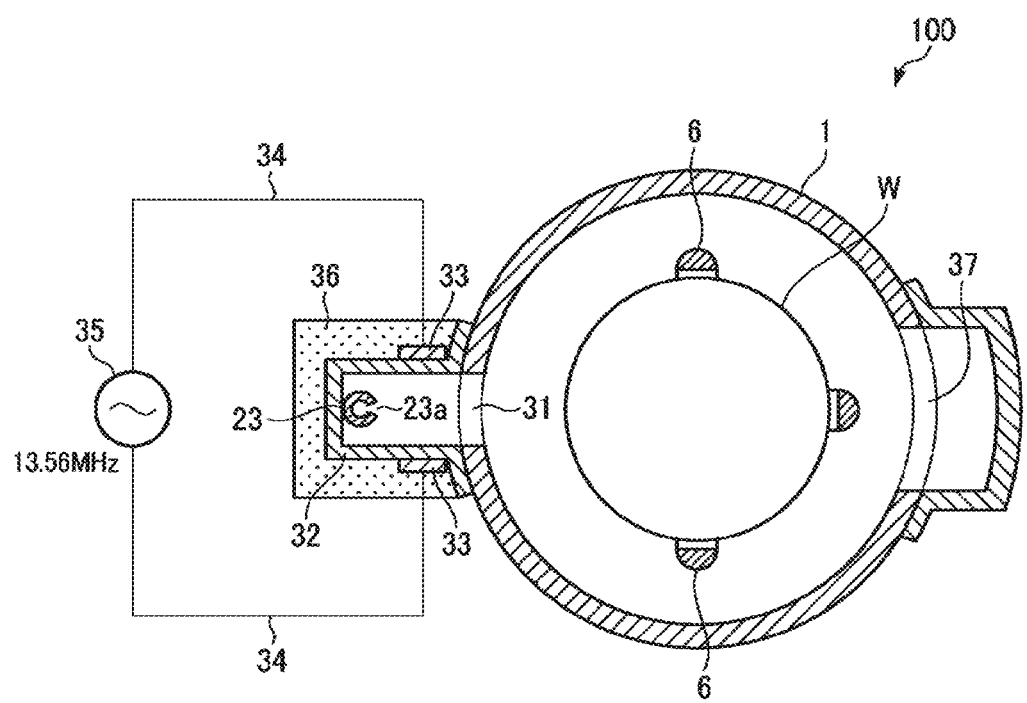
FIG. 3 is a horizontal sectional view of the etching apparatus shown in FIG. 2.

FIG. 2 is a vertical sectional view showing an example of an etching apparatus which may be used for carrying out an etching method according to an embodiment of the present disclosure, and FIG. 3 is a horizontal sectional view of the etching apparatus shown in FIG. 2.

An etching apparatus 100 of this example includes a cylindrical processing container 1 having a ceiling with its lower end opened. The entire processing container 1 is made of, for example, quartz. A ceiling plate 2 made of quartz is provided in the vicinity of an upper end portion inside the processing container 1 so that a region defined below the ceiling plate 2 is sealed. In addition, a metal-made manifold 3 formed in a cylindrical shape is connected to a lower end opening of the processing container 1 via a seal member 4 such as an O ring or the like.

The manifold 3 supports the lower end of the processing container 1. A quartz-made wafer boat 5 holding a plurality of, for example, 50 to 100, semiconductor wafers (silicon wafers) W as substrates in multiple stages is inserted into the processing container 1 from below the manifold 3. The wafer boat 5 includes three rods 6 (see FIG. 3). The wafers W are supported by grooves (not shown) formed in the rods 6.

The wafer boat 5 is placed on a table 8 via a quartz-made heat-insulating cylinder 7. The table 8 is supported on a rotary shaft 10 that penetrates a lid 9 made of metal (stainless steel) and configured to open and close a lower end opening of the manifold 3.

A magnetic fluid seal 11 is provided in the penetrating portion of the rotary shaft 10. The magnetic fluid seal 11 rotatably supports the rotary shaft 10 while airtightly sealing the rotary shaft 10. A seal member 12 for keeping the inside of the processing container 1 in a sealed state is interposed between a peripheral portion of the lid 9 and the lower end portion of the manifold 3.

The rotary shaft 10 is attached to the tip of an arm 13 supported by, for example, an elevating mechanism (not shown) such as a boat elevator or the like. The wafer boat 5 and the lid 9 are raised and lowered together and are inserted into and removed from the inside of the processing container 1. Alternatively, the table 8 may be fixedly provided at the side of the lid 9 so that the wafer W can be processed without rotating the wafer boat 5.

The etching apparatus 100 further includes an etching gas supply mechanism 15 for supplying an etching gas composed of an $H_2$ gas or an $NH_3$ gas into the processing container 1, and an inert gas supply mechanism 17 for supplying an inert gas as a purge gas, for example, an $N_2$ gas or an Ar gas, into the processing container 1.

The etching gas supply mechanism 15 includes an etching gas supply source 21, a gas pipe 22 for introducing the etching gas from the etching gas supply source 21, and a gas dispersion nozzle 23 for introducing the etching gas into the processing container 1 therethrough.

The gas dispersion nozzle 23 is made of quartz. The gas dispersion nozzle 23 passes through a side wall of the manifold 3 and extends into the manifold 3. The gas dispersion nozzle 23 is bent upward and extends vertically. A plurality of gas discharge holes 23a is formed at predetermined intervals in the vertical portion of the gas dispersion nozzle 23 over the vertical length corresponding to a wafer support range of the wafer boat 5. The etching gas may be discharged substantially uniformly from the gas discharge holes 23a toward the processing container 1 in the horizontal direction. In FIG. 3, only one gas dispersion nozzle 23 is provided. Alternatively, a plurality of gas dispersion nozzles 23 may be provided.

The inert gas supply mechanism 17 includes an inert gas supply source 27, a gas pipe 28 for introducing the inert gas from the inert gas supply source 27 therethrough, and a gas nozzle 29 made of a short quartz tube and connected to the gas pipe 28. The gas nozzle 29 is provided so as to penetrate the side wall of the manifold 3.

Opening/closing valves 22a and 28a and flow rate controllers 22b and 28b (for example, mass flow controllers) are provided in the gas pipes 22 and 28, respectively.

A plasma generation mechanism 30 is formed in a portion of the side wall of the processing container 1. The plasma generation mechanism 30 excites (namely, plasma-converts) the etching gas composed of an $H_2$ gas or an $NH_3$ gas and supplies the plasma-converted etching gas into the processing container 1.

The plasma generation mechanism 30 includes a plasma partition wall 32 airtightly welded to the outer wall of the processing container 1. The plasma partition wall 32 is made of, for example, quartz. The plasma partition wall 32 has a concave cross section and covers an opening 31 formed in the side wall of the processing container 1. The opening 31 is formed in a vertically elongated shape so as to vertically cover all the semiconductor wafers W supported by the wafer boat 5. The above-described gas dispersion nozzle 23 for discharging the etching gas is provided in an inner space defined by the plasma partition wall 32, namely, inside the plasma generation space.

The plasma generation mechanism 30 further includes a pair of elongated plasma electrodes 33 arranged on outer surfaces of both side walls of the plasma partition wall 32 so as to face each other along the vertical direction, and a high-frequency power source 35 connected to the plasma electrodes 33 via power supply lines 34 and configured to supply high frequency power to the plasma electrodes 33. The high-frequency power source 35 applies a high frequency voltage of, for example, 13.56 MHz, to the plasma electrodes 33. Thus, a high frequency electric field is formed inside the plasma generation space defined by the plasma partition wall 32. The etching gas discharged from the gas dispersion nozzle 23 is converted into plasma inside the plasma generation space to which the high frequency electric field is applied. The plasma-converted etching gas is supplied into the processing container 1 through the opening 31.

An insulating protection cover 36 is attached to the outer surface of the plasma partition wall 32 so as to cover the plasma partition wall 32. A coolant flow path (not shown) is formed inside the insulating protection cover 36. The plasma electrodes 33 are cooled down by allowing a coolant such as a cooled $NH_3$ gas or the like to flow through the coolant flow path.

An exhaust port 37 for evacuating the interior of the processing container 1 is formed in the side wall portion of the processing container 1 opposite the opening 31. The exhaust port 37 is formed in a vertically elongated shape so as to correspond to the wafer boat 5. An exhaust port cover member 38 formed in a U-shaped cross section so as to cover the exhaust port 37 is attached to a portion corresponding to the exhaust port 37 in the processing container 1. The exhaust port cover member 38 extends upward along the side wall of the processing container 1. An exhaust pipe 39 for evacuating the processing container 1 via the exhaust port 37 is connected to a lower portion of the exhaust port cover member 38. A pressure control valve 40 for controlling an internal pressure of the processing container 1 and an exhaust device 41 including a vacuum pump and the like are connected to the exhaust pipe 39. The inside of the processing container 1 is exhausted by the exhaust device 41 through the exhaust pipe 39. In addition, a cylindrical heating mechanism 42 for heating the processing container 1 and the wafers W accommodated in the processing container 1 is provided so as to surround the outer circumference of the processing container 1.

The etching apparatus 100 includes a control part 50. The control part 50 performs the control of the respective component parts of the etching apparatus 100, for example, the controlling the flow rate of the respective gases by the opening and closing of the valves 22a and 28a, the control of gas flow rates by the flow rate controllers 22b and 28b, the control of exhaust by the exhaust device 41, the on/off control of high frequency power by the high-frequency power source 35, the control of the temperature of the wafer W by the heating mechanism 42, and the like. The control part 50 includes a CPU (computer), a main control part that performs the aforementioned controls, an input device, an output device, a display device, and a memory device. A storage medium that stores a program for controlling process to be executed in the etching apparatus 100, namely a process recipe, is set in the memory device. The main control part reads a predetermined process recipe stored in the storage medium and controls operations so that a predetermined process is performed by the etching apparatus 100 based on the process recipe.

<Etching Method Performed by Etching Apparatus 100>

Next, an etching method performed by the etching apparatus 100 configured as above will be described.

First, an internal temperature of the processing container 1 is set to 200 to 400 degrees C. The wafer boat 5 holding 50 to 100 wafers W is loaded into the processing container 1. An inert gas is allowed to flow into the processing container 1. While evacuating the inside of the processing container 1 by the exhaust device 41, the internal pressure of the processing container 1 is adjusted to 0.05 to 1 Torr (6.7 to 133 Pa).

Next, while evacuating the inside of the processing container 1, an etching gas composed of an $H_2$ gas or an $NH_3$ gas, which is supplied from the etching gas supply source 21, is converted into plasma by the plasma generation mechanism 30. Then, the plasma-converted etching gas is supplied into the processing container 1 so as to act on the germanium film formed on the wafer W. The conditions at this time may be set such that the high frequency (RF) power is 100 to 1,000 W, and the time is 1 to 100 min. In addition, a flow rate of the etching gas may be 1.000 to 10,000 sccm when the etching gas is an $NH_3$ gas. The flow rate of the etching gas may be 500 to 5,000 sccm when the etching gas is an $H_2$ gas.

The etching is performed for a predetermined period of time. When the germanium film is etched by a predetermined amount, the valve 22a is closed to stop the etching. Thereafter, while evacuating the inside of the processing container 1 through the exhaust pipe 39 by the exhaust device 41, the inside of the processing container 1 is purged with an inert gas. Then, after the internal pressure of the processing container 1 is restored to an atmospheric normal pressure, the wafer boat 5 is lowered and the wafer W is unloaded from the wafer boat 5.

<Experimental Example 1>

Experimental example 1 will now be described.

FIGS. 4A to 4E are SEM photographs showing cross sections of initial blanket samples before etching treatments in experimental example 1. In experimental example 1, blanket samples (hereinafter referred to as samples) in which a thermally oxidized $SiO_2$ film and a Ge film or a SiGe film or a Si film are formed on a Si substrate in the named order were prepared as shown in FIGS. 4A to 4E. Etching treatments were performed on the samples using the etching apparatus shown in FIGS. 2 and 3.

Figure 4A:
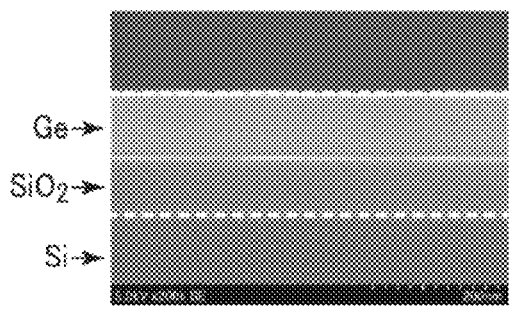
FIGS. 4A to 4E are SEM photographs showing cross sections of initial blanket samples before etching treatments in an experimental example 1.
Figure 4B:
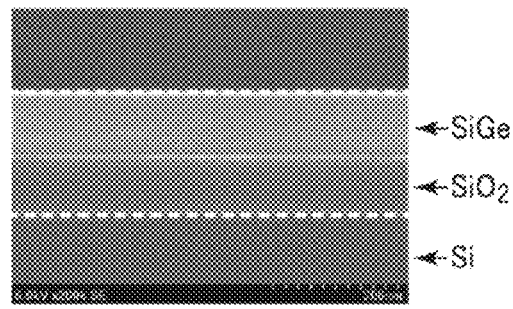
Figure 4C:
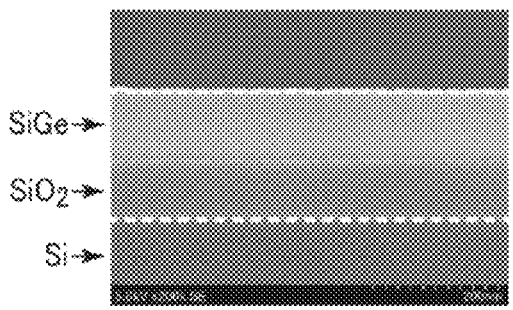
Figure 4D:
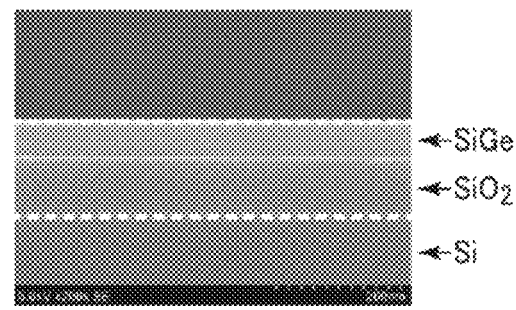
Figure 4E:
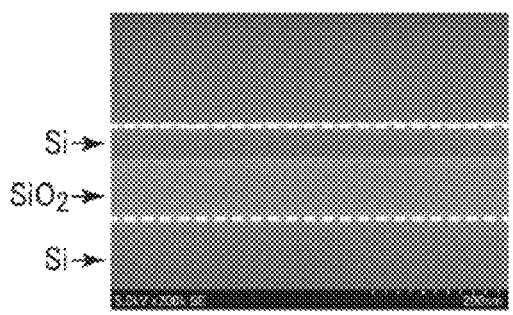

In experimental example 1, a plurality of samples A to E were prepared in which five types of films having different Ge content ratios (at %) are formed by a CVD method as films formed on thermally oxidized $SiO_2$ films. Specifically, the samples A to E are five types of samples, namely sample A including a germanium film with a Ge content concentration of 100% as shown in FIG. 4A, sample B including a silicon germanium film with a Ge content concentration of 88% as shown in FIG. 4B, sample C including a silicon germanium film with a Ge content concentration of 75% as shown in FIG. 4C, sample D including a silicon germanium film with a Ge content concentration of 67% as shown in FIG. 4D, and sample E including a silicon film with a Si content concentration of 100% as shown in FIG. 4E.

Incidentally, "unavoidable impurities" may be contained in the above samples A to E. The term "unavoidable impurities" means impurities unavoidably mixed in a manufacturing process. In the case of this example, the unavoidable impurities are mainly hydrogen (H).

Next, etching conditions will be described. In experimental example 1, etching treatments were performed on the aforementioned five kinds of samples A to E using four kinds of gases, namely an $NH_3$ gas, an $H_2$ gas, an $O_2$ gas and an $N_2$ gas, as etching gases. Etching conditions are as follows.

Temperature: 300 degrees C.
Pressure: 0.2 Torr (26.6 Pa)
Gas flow rate: 5 slm (2 slm for $H_2$ gas alone)
RF power: 500 W
Treatment time: 30 min It should be noted that the gas flow rate during the etching treatments is 5 slm (5,000 sccm) for the $NH_3$ gas, the $O_2$ gas and the $N_2$ gas, but 2 slm (2000 sccm) for the $H_2$ gas alone.

[Etching by $NH_3$ Gas Plasma]

Figure 5A:
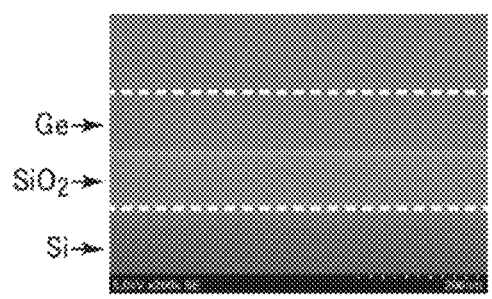
FIGS. 5A to 5E are SEM photographs showing cross sections of post-treatment blanket samples after etching treatments with an $NH_3$ gas in the experimental example 1.
Figure 5B:
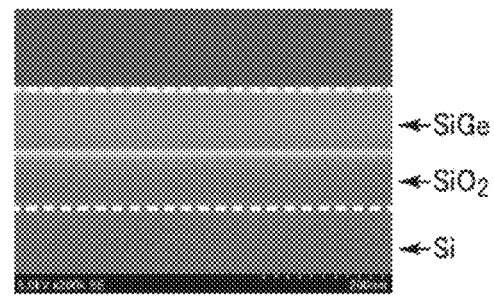
Figure 5C:
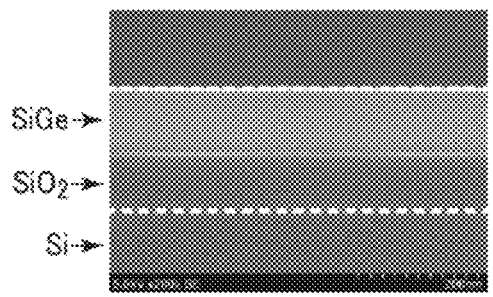
Figure 5D:
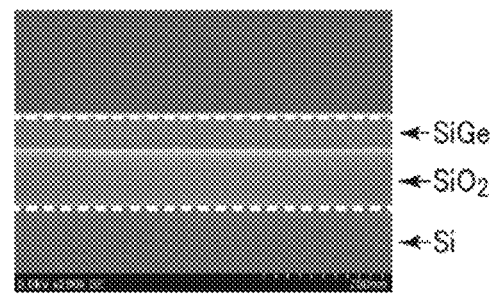
Figure 5E:
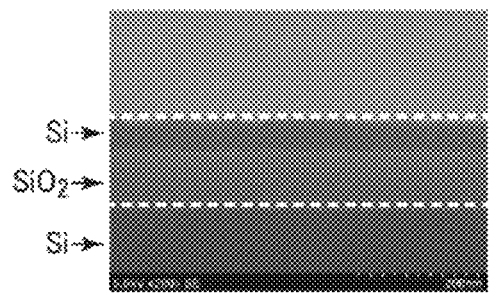

FIGS. 5A to 5E are SEM photographs showing cross sections of post-treatment samples A to E after etching treatments with an $NH_3$ gas in experimental example 1. Specifically, FIG. 5A is a SEM photograph showing a cross section of sample A after an etching treatment, FIG. 5B is a SEM photograph showing a cross section of sample B after an etching treatment, FIG. 5C is a SEM photograph showing a cross section of sample C after an etching treatment, FIG. 5D is a SEM photograph showing a cross section of sample D after an etching treatment, and FIG. 5E is a SEM photograph showing a cross section of sample E after an etching treatment.

From the SEM photograph shown in FIG. 5A, it can be noted that when the etching treatment is performed using the $NH_3$ gas as an etching gas, the Ge film is completely etched and removed. Since the Ge film has a film thickness of 100 nm or more, when the etching treatment time (30 min) is taken into account, it can be seen that the etching rate is at least 3.3 nm/min. Furthermore, it can be seen that the thermally oxidized $SiO_2$ film is not etched and remains unremoved. Moreover, from the SEM photographs shown in FIGS. 5B to 5E, it can be noted that the SiGe film and the Si film are not etched and remain unremoved.

From the above, it can be seen that when the etching treatment is performed using the $NH_3$ gas as an etching gas, only the Ge film is etched, but the thermally oxidized $SiO_2$ film, the SiGe film and the Si film remains unetched. From this, it can be understood that the Ge film is selectively etched with a very high selection ratio with respect to the SiGe film, the Si film and ultimately the $SiO_2$ film. In particular, it can be seen that a high etching selectivity is obtained even for a Ge-rich SiGe film containing Ge of 88 at %.

[Etching by $H_2$ Gas Plasma]

Figure 6A:
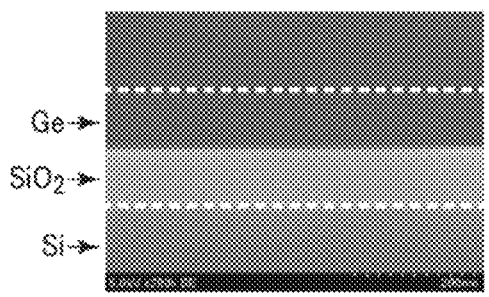
FIGS. 6A to 6E are SEM photographs showing cross sections of post-treatment blanket samples after etching treatments with an $H_2$ gas in the experimental example 1.
Figure 6B:
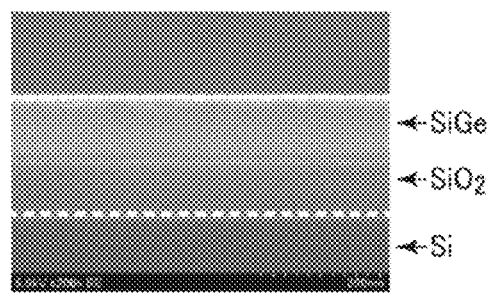
Figure 6C:
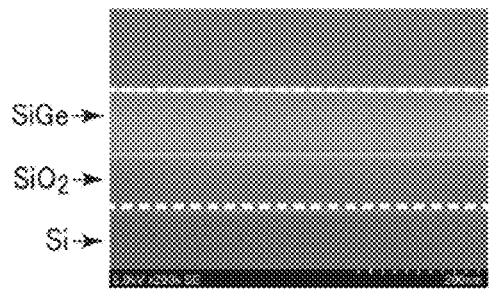
Figure 6D:
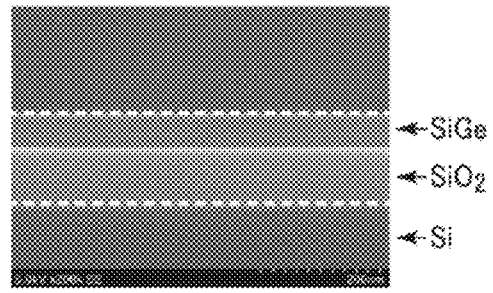
Figure 6E:
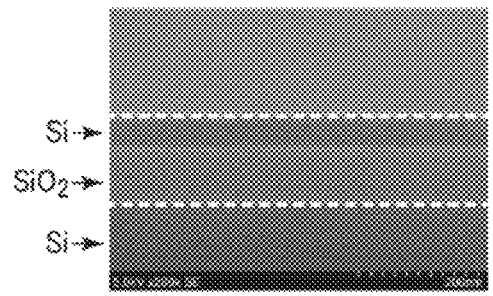

FIGS. 6A to 6E are SEM photographs showing cross sections of post-treatment samples A to E after etching treatments with an $H_2$ gas in experimental example 1. Specifically, FIG. 6A is a SEM photograph showing a cross section of sample A after an etching treatment, FIG. 6B is a SEM photograph showing a cross section of sample B after an etching treatment, FIG. 6C is a SEM photograph showing a cross section of sample C after an etching treatment, FIG. 6D is a SEM photograph showing a cross section of sample D after an etching treatment, and FIG. 6E is a SEM photograph showing a cross section of sample E after an etching treatment.

From the SEM photograph shown in FIG. 6A, it can be understood that when the etching treatment is performed using the $H_2$ gas as an etching gas, the Ge film is completely etched and removed. Since the Ge film has a film thickness of 100 nm or more, when the etching treatment time (30 min) is taken into account, it can be seen that the etching rate is at least 3.3 nm/min. Furthermore, it can be seen that the thermally oxidized $SiO_2$ film is not etched and remains unremoved. Moreover, from the SEM photograph shown in FIG. 6B, it can be understood that the surface of the SiGe film having a Ge concentration of 88% is locally etched but the SiGe film remains substantially unetched. In addition, from the SEM photographs shown in FIGS. 6C to 6E, it can be seen that the SiGe film having another Ge concentration and the Si film are not etched and remain unremoved.

From the above, it can be noted that when the etching treatment is performed using the $H_2$ gas as an etching gas, the Ge film is mainly etched. As for sample B, the SiGe film is slightly etched, but the etching rate thereof is very low. Thus, the SiGe film is hardly etched. It can be seen that the SiGe film and the Si film of samples C and D are not etched. From this, it can be understood that the Ge film is selectively etched with respect to the SiGe film, the Si film and ultimately the $SiO_2$ film. In particular, it can be seen that a high etching selectivity is obtained even for a Ge-rich SiGe film containing Ge of 88 at %.

[Etching by $O_2$ Gas Plasma]

Figure 7A:
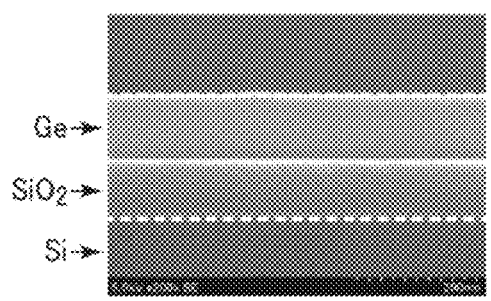
FIGS. 7A to 7E are SEM photographs showing cross sections of post-treatment blanket samples after etching treatments with an $O_2$ gas in the experimental example 1.
Figure 7B:
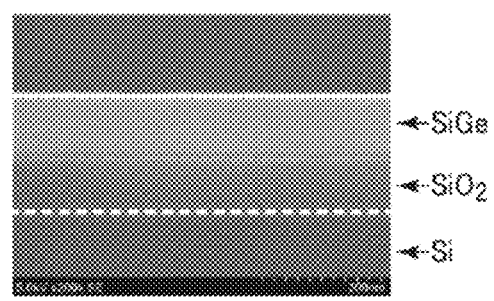
Figure 7C:
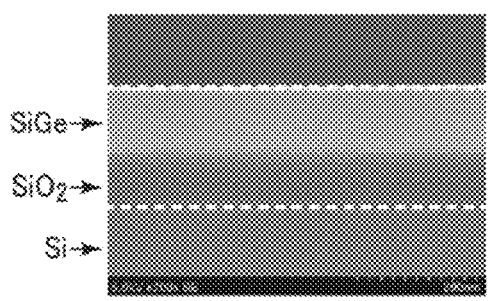
Figure 7D:
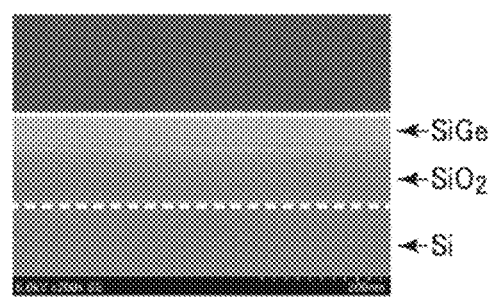
Figure 7E:
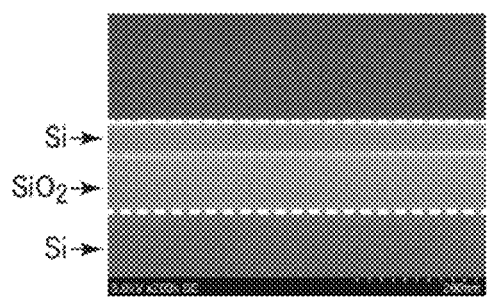

FIGS. 7A to 7E are SEM photographs showing cross sections of post-treatment samples A to E after etching treatments with an $O_2$ gas in experimental example 1. Specifically, FIG. 7A is a SEM photograph showing a cross section of sample A after an etching treatment, FIG. 7B is a SEM photograph showing a cross section of sample B after an etching treatment, FIG. 7C is a SEM photograph showing a cross section of sample C after an etching treatment, FIG. 7D is a SEM photograph showing a cross section of sample D after an etching treatment, and FIG. 7E is a SEM photograph showing a cross section of sample E after an etching treatment.

From the SEM photographs shown in FIGS. 7A to 7E, it can be noted that when the etching treatment is performed using the $O_2$ gas as an etching gas, the germanium film, the silicon germanium film and the silicon film are not etched and remain unremoved.

From the above, it can be seen that when the etching treatment is performed using the $O_2$ gas as an etching gas, the germanium film, the silicon germanium film and the silicon film are not etched.

[Etching by $N_2$ Gas Plasma]

Figure 8A:
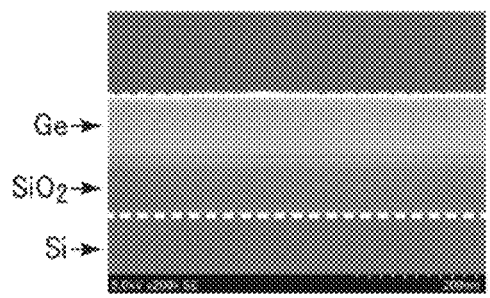
FIGS. 8A to 8E are SEM photographs showing cross sections of post-treatment blanket samples after etching treatments with an $N_2$ gas in the experimental example 1.
Figure 8B:
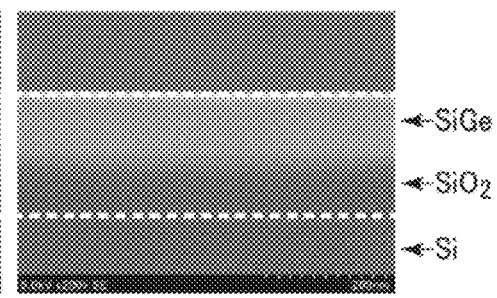
Figure 8C:
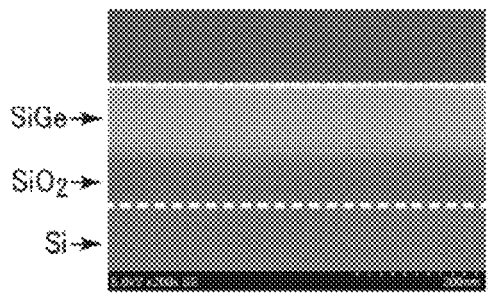
Figure 8D:
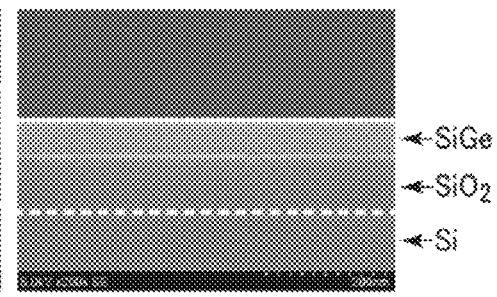
Figure 8E:
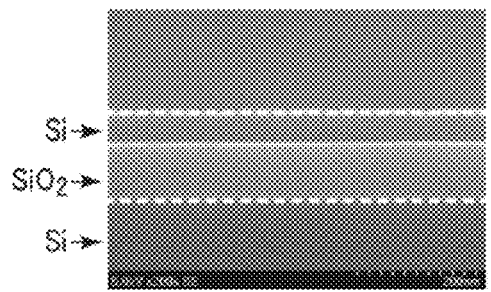

FIGS. 8A to 8E are SEM photographs showing cross sections of post-treatment samples A to E after etching treatments with an $N_2$ gas in experimental example 1. Specifically, FIG. 8A is a SEM photograph showing a cross section of sample A after an etching treatment, FIG. 8B is a SEM photograph showing a cross section of sample B after an etching treatment, FIG. 8C is a SEM photograph showing a cross section of sample C after an etching treatment, FIG. 8D is a SEM photograph showing a cross section of sample D after an etching treatment, and FIG. 8E is a SEM photograph showing a cross section of sample E after an etching treatment.

From the SEM photographs shown in FIGS. 8A to 8E, it can be noted that when the etching treatment is performed using the $N_2$ gas as an etching gas, the germanium film, the silicon germanium film and the silicon film are not etched and remain unremoved.

From the above, it can be seen that when the etching treatment is performed using the $N_2$ gas as an etching gas, the germanium film, the silicon germanium film and the silicon film are not etched.

<Experimental Example 2>

Experimental example 2 will now be described.

Figure 9:
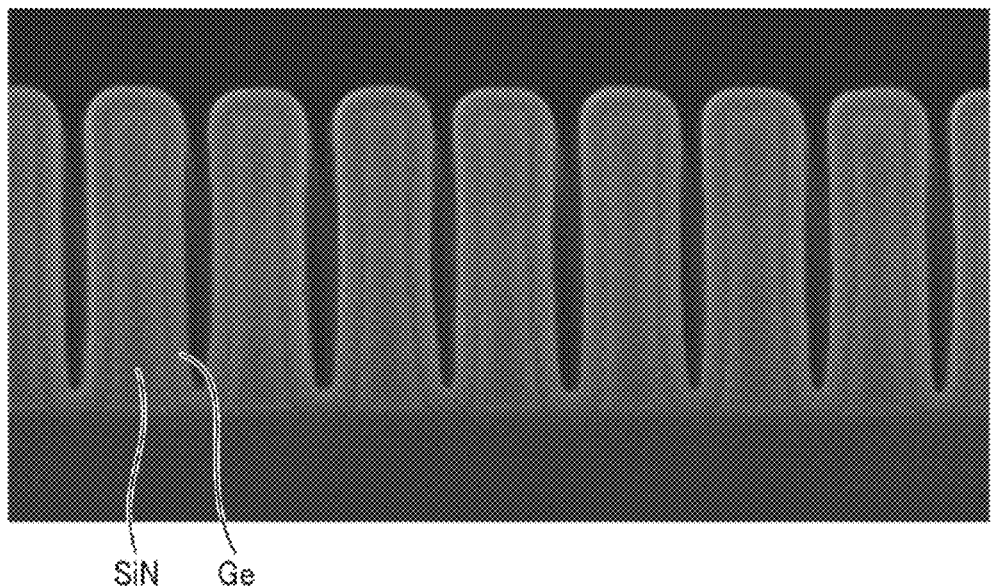
FIG. 9 is an SEM photograph showing a cross section of an initial sample before an etching treatment in an experimental example 2.

FIG. 9 is an SEM photograph showing a cross section of an initial sample before an etching treatment in experimental example 2. In experimental example 2, a sample in which a SiN film having a plurality of recesses (trenches) formed at substantially equal intervals and a Ge film are formed on a Si substrate in the named order as shown in FIG. 9 was prepared. An etching treatment was performed on such a sample using the etching apparatus shown in FIGS. 2 and 3.

As shown in FIG. 9, in the sample of experimental example 2, a Ge film was formed to such an extent that the recesses (trenches) of the SiN film are not completely embedded. However, "unavoidable impurities" may be contained in the Ge film formed in this manner. The term "unavoidable impurities" means a trace amount of impurities unavoidably mixed in a manufacturing process. In the case of this example, the "unavoidable impurities" are mainly hydrogen (H).

Next, etching conditions will be described. In experimental example 2, an etching treatment was performed on the sample prepared as described above, using the $H_2$ gas as an etching gas. Etching conditions are as follows.

Figure 10:
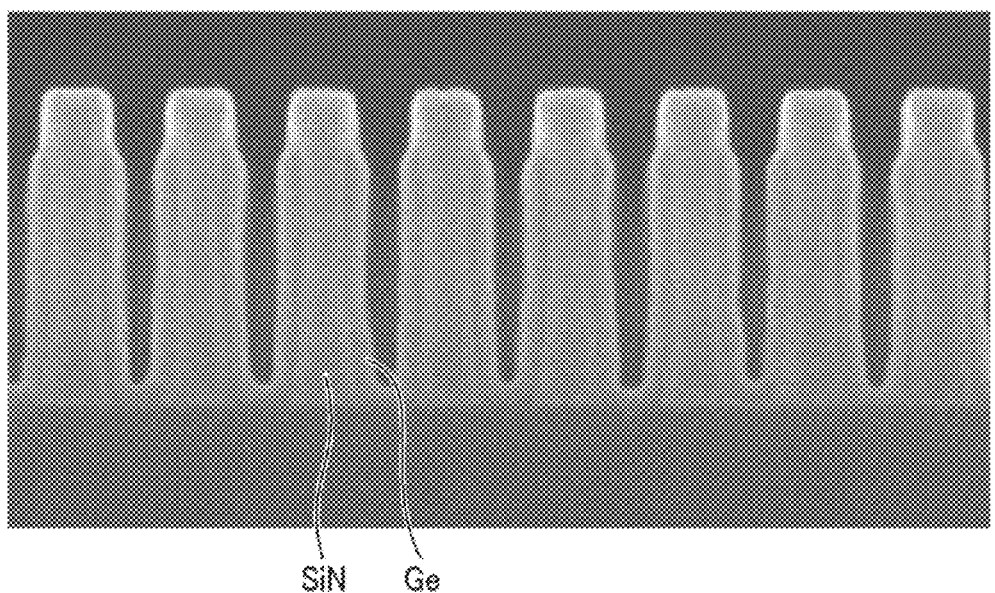
FIG. 10 is an SEM photograph showing a cross section of a post-treatment sample after an etching treatment with an $H_2$ gas in the experimental example 2.

Temperature: 300 degrees C.
Pressure: 0.2 Tort (26.6 Pa)
Gas flow rate: 2 slm (2,000 sccm)
RF power: 500 W
Treatment time: 20 min FIG. 10 is a SEM photograph showing a cross section of a post-treatment sample after an etching treatment with an $H_2$ gas in experimental example 2. From the SEM photograph shown in FIG. 10, it can be seen that when the etching treatment is performed using the $H_2$ gas as an etching gas, the germanium film formed on the SiN film is vertically etched from the top to the bottom of the trenches. It can also be seen that the silicon nitride film is not etched and remains unremoved.

From the above, it can be understood that the etching of the germanium film has anisotropy. It can also be understood that the germanium film is selectively etched with respect to the silicon nitride film.

<Other Applications>

While the embodiment of the present disclosure has been described above, the present disclosure is not limited to the above-described embodiment, and various modifications may be made without departing from the spirit thereof.

For example, in the above-described embodiment, there is shown an example in which the method of the present disclosure is carried out by a vertical batch type apparatus. However, the present disclosure is not limited thereto. The method of the present disclosure may be carried out by other various etching apparatuses such as a horizontal batch type apparatus (an apparatus of the type in which a plurality of vertically placed wafers are arranged in a lateral direction and the wafers thus aligned are collectively processed), a single-substrate type apparatus (of the type in which horizontally placed wafers are processed one by one), and the like.

In the above-described embodiment, there is shown an example in which plasma is generated by applying high frequency power to a pair of plasma electrodes. However, the method of generating plasma is not limited thereto. Plasma may be generated by other methods such as an inductive coupling method, a microwave method, and the like.

While there has been shown a case where a semiconductor wafer is used as a target substrate, the present disclosure is not limited thereto. It is needless to say that the present disclosure may be applied to other substrates such as a glass substrate for a flat panel display, a ceramic substrate, and the like.

According to the present disclosure, it is possible to selectively etch germanium (Ge) with respect to other materials through a dry etching process. In addition, according to the present disclosure, it is possible to etch germanium (Ge) by using a simple gas system that does not use a halogen-based gas such as fluorine (F), chlorine (Cl) or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method, comprising:
supplying an etching gas including an $H_2$ gas or an $NH_3$ gas to a target substrate having an insulating film including a silicon-containing material and a germanium film not containing silicon formed above the insulating film, the etching gas being in an excited state; and
selectively etching the germanium film with respect to the insulating film.

2. The method of claim 1, wherein the insulating film is one selected from a group consisting of a silicon film, a silicon germanium film, a silicon nitride film and a silicon oxide film.

3. The method of claim 1, wherein in the etching, a pressure is set to fall within a range of 6.7 to 133 Pa.

4. The method of claim 1, wherein in the etching, a temperature of the target substrate is set to fall within a range of 200 to 400 degrees C.

5. The method of claim 1, wherein the etching gas is supplied in a plasma-converted state.

6. A non-transitory computer-readable storage medium operating on a computer and storing a program for controlling an etching apparatus,
   wherein when the program is executed by the computer, the program controls the etching apparatus to perform the etching method of claim 1.

* * * * *